(12) United States Patent
Kok et al.

(10) Patent No.: US 8,049,864 B2
(45) Date of Patent: Nov. 1, 2011

(54) DEVICE MANUFACTURING METHOD AND LITHOGRAPHIC APPARATUS

(75) Inventors: Haico Victor Kok, Veldhoven (NL); Johannes Jacobus Matheus Baselmans, Oirschot (NL); Marcus Adrianus Van De Kerkhof, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 325 days.

(21) Appl. No.: 12/345,105

(22) Filed: Dec. 29, 2008

(65) Prior Publication Data

US 2009/0168039 A1    Jul. 2, 2009

Related U.S. Application Data

(60) Provisional application No. 61/009,194, filed on Dec. 27, 2007.

(51) Int. Cl.
*G03B 27/42* (2006.01)
*G03B 27/54* (2006.01)

(52) U.S. Cl. ............................................ 355/53; 355/67

(58) Field of Classification Search .................... 355/53, 355/55, 67–71; 356/515, 399–401
See application file for complete search history.

(56) References Cited

U.S. PATENT DOCUMENTS

| | | | |
|---|---|---|---|
| 6,737,662 B2 | 5/2004 | Mulder et al. | |
| 7,268,890 B2 * | 9/2007 | Emer | 356/515 |
| 7,308,368 B2 | 12/2007 | Kok et al. | |
| 2007/0081138 A1 | 4/2007 | Kerkhof et al. | |

FOREIGN PATENT DOCUMENTS

| | | |
|---|---|---|
| JP | 11-003849 A | 1/1999 |
| JP | 2003-022967 A | 1/2003 |
| JP | 2003-318090 A | 11/2003 |
| JP | 2006-114888 A | 4/2006 |
| JP | 2007-110116 A | 4/2007 |
| JP | 2009-105417 A | 5/2009 |

OTHER PUBLICATIONS

Mark van de Kerkhof et al., "Full optical column characterization of DUV lithographic projection tools", in Proceedings of the SPIE, vol. 5377, pp. 1960-1970 (2004).
English language Abstract of Japanese Patent Publication No. 11-003849 A, published Jan. 6, 1999; 1 page.

(Continued)

*Primary Examiner* — Hung Henry Nguyen
(74) *Attorney, Agent, or Firm* — Sterne, Kessler, Goldstein & Fox P.L.L.C.

(57) ABSTRACT

A device manufacturing method includes a measurement phase and an exposure phase. The measurement phase includes conditioning a radiation beam with a first beam condition, forming the patterned radiation beam by imparting the radiation beam with the first beam condition with a first pattern in its cross-section, and projecting the patterned beam onto a sensor capable of providing a sensor output signal. The exposure phase includes fast switching the conditioning of the radiation beam to a second beam condition, the second beam condition being different from the first beam condition, forming the patterned radiation beam by imparting the radiation beam with the second beam condition with a second pattern in its cross-section, the second pattern being provided by a patterning device, and projecting the patterned beam onto a target portion of the substrate.

34 Claims, 8 Drawing Sheets

OTHER PUBLICATIONS

English language Abstract of Japanese Patent Publication No. 2003-022967 A, published Jan. 24, 2003; 1 page.

English language Abstract of Japanese Patent Publication No. 2003-318090 A, published Nov. 11, 2003; 1 page.

English language Abstract of Japanese Patent Publication No. 2006-114888 A, published Apr. 27, 2006; 1 page.

English language Abstract of Japanese Patent Publication No. 2007-110116 A, published Apr. 26, 2007; 1 page.

English language Abstract of Japanese Patent Publication No. 2009-105417 A, published May 14, 2009; 1 page.

English translation of Japanese Notice Reasons for Rejection directed to related application No. 2008-323014, mailed Jun. 17, 2011 from the Japanese Patent Office; 3 pages.

* cited by examiner

*Fig 3* _Prior art_
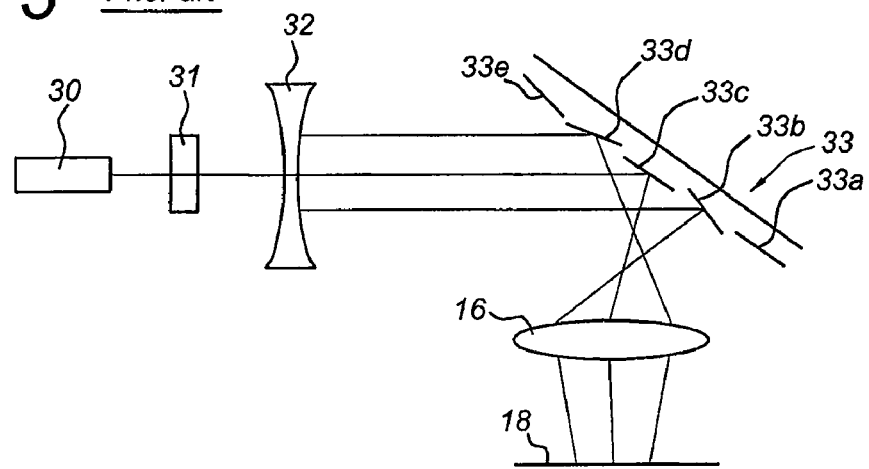
*Fig 4a* _Prior art_
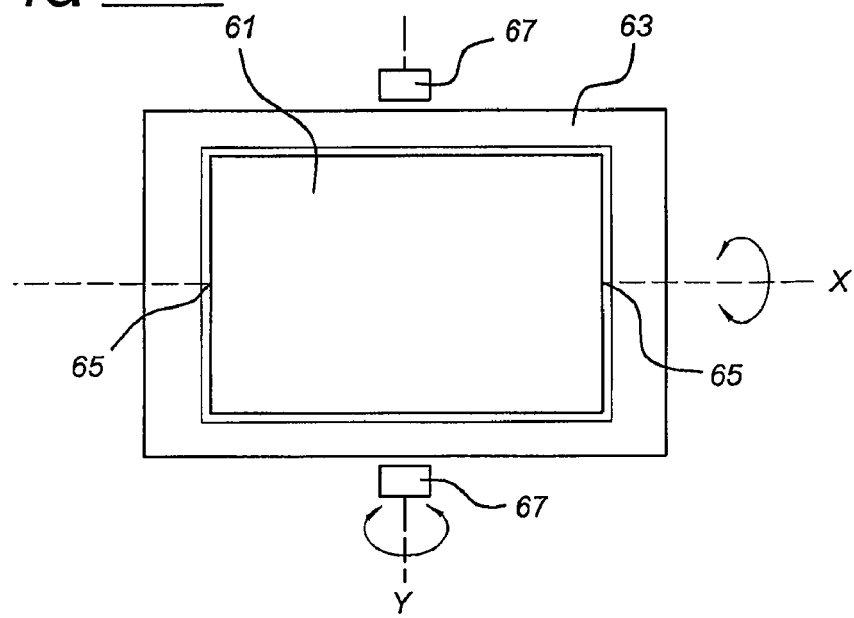
*Fig 4b* _Prior art_
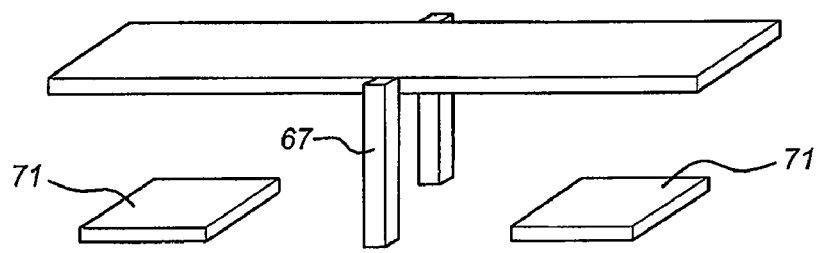

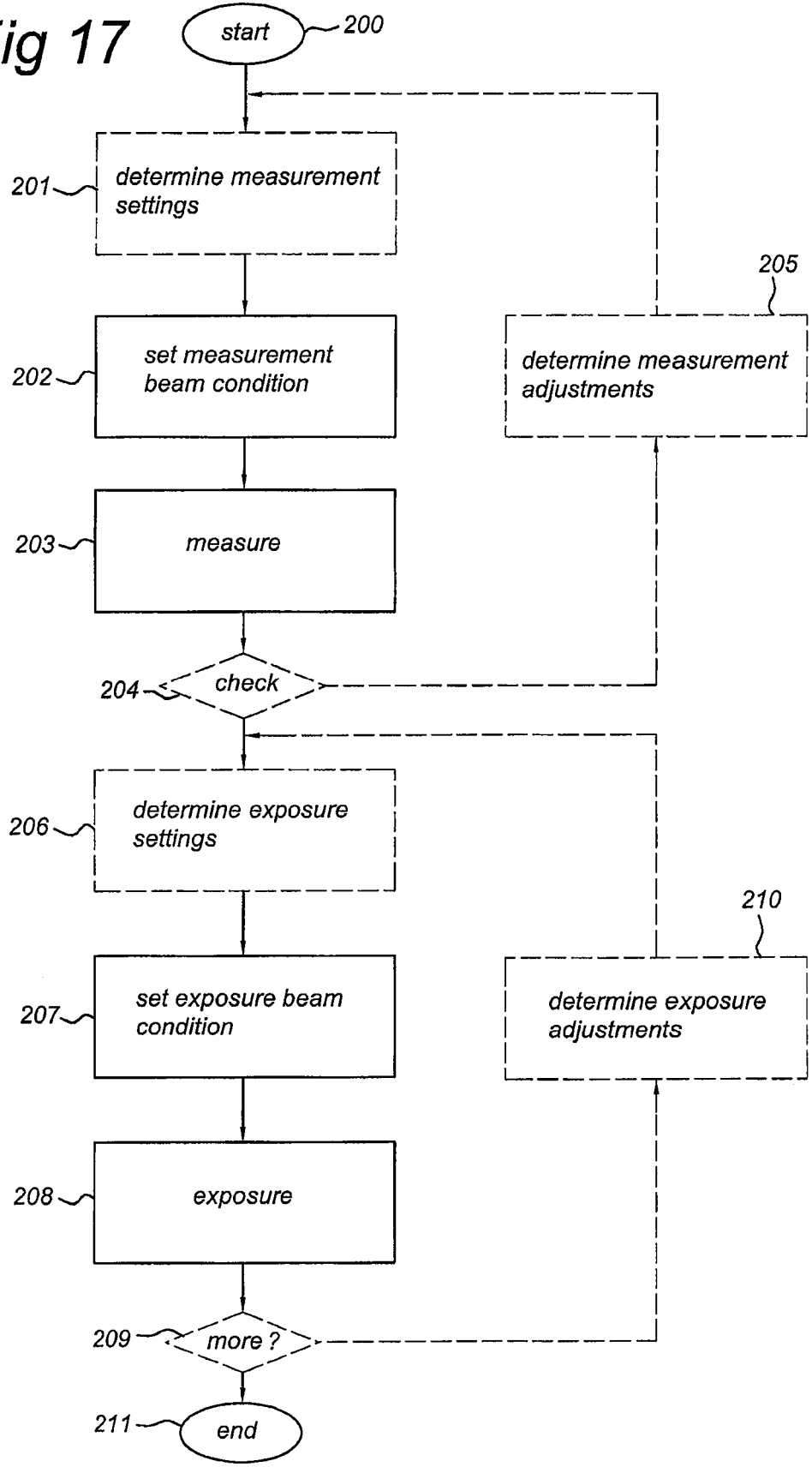

DEVICE MANUFACTURING METHOD AND LITHOGRAPHIC APPARATUS

CROSS-REFERENCE TO RELATED APPLICATIONS

The present application claims the benefit of U.S. Provisional Patent Appl. No. 61/009,194, filed Dec. 27, 2007, which is incorporated by reference herein in its entirety.

BACKGROUND

1. Field

Embodiments of the present invention relate to a method for manufacturing a device and to a lithographic apparatus.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging with a radiation beam with a radiation beam mode onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

U.S. Appl. Publ. No. 2007/081138 A1, incorporated herein by reference in its entirety, describes a device manufacturing method using a lithographic apparatus in which, during an alignment calibration process in the lithographic apparatus using a sensor to detect a property of a projected image at substrate level, a diffuser is inserted into the radiation beam to increase the range of angles of radiation incident on the substrate. Thereby it can be ensured that sufficient radiation enters the sensor even when there is a mismatch between the radiation beam mode used and the acceptance NA of the sensor.

It may be a disadvantage of the known apparatus and the known method that the diffuser is to be physically moved from a first position outside the path of the radiation beam to a second position inside the radiation beam. This movement requires some time to complete and may negatively effect the through-put time of the apparatus.

It may be a further disadvantage of the known apparatus and the known method that they may not function well with any possible illumination mode, i.e. the radiation beam mode used for illumination of the substrate. For example, for an illumination mode with a very steep illumination profile in one or more very narrow angular ranges, such as a steep quadrupole profile filling only a small portion of the pupil, the mismatch between the illumination mode and the sensor acceptance range may be too large to allow to be compensated for by the diffuser. In particular, as the form of the diffuser will depend on the degree and nature of the mismatch between the illumination mode and the sensor acceptance range, it may be needed to use a diffuser of a form that is not available.

It may be a further disadvantage of the known apparatus and the known method that the mechanical movement of the diffuser over quite a significant distance may result in disturbances to the illumination beam, e.g. to mechanical vibrations.

It may be a further disadvantage of the known apparatus and the known method that the resulting diffuse beam may not be compatible with a measurement and/or alignment system of the lithographic apparatus. For example, a diffuse beam may conflict with performing an interferometric measurement on the beam quality or using an interferometric alignment method.

It may be a further disadvantage of the known apparatus and the known method that the effect of the diffuser is limited to increasing the range of angles at which radiation of the illumination beam is incident on a marker on the patterning device.

SUMMARY

The inventors have invented a lithographic apparatus which overcomes or mitigates one or more shortcomings of the apparatus described in the prior art.

According to an aspect of the invention, there is provided a device manufacturing method for projecting a patterned beam of radiation onto a substrate, including, in a measurement phase, conditioning a radiation beam with a first beam condition, forming the patterned radiation beam by imparting the radiation beam with the first beam condition with a first pattern in its cross-section, and projecting the patterned beam onto a sensor capable of providing a sensor output signal; and in an exposure phase, switching the conditioning of the radiation beam to a second beam condition, the second beam condition being different from the first beam condition, forming the patterned radiation beam by imparting the radiation beam with the second beam condition with a second pattern in its cross-section, the second pattern being provided by a patterning device, and projecting the patterned beam onto a target portion of the substrate.

According to an aspect of the invention, there is provided a lithographic apparatus including an illumination system configured to condition a radiation beam, a support constructed to support a patterning device, at least one of the support and the patterning device being capable of imparting the radiation beam with a pattern in its cross-section to form a patterned radiation beam, a sensor being capable to receive at least part of the patterned radiation beam and to provide a sensor output signal, and a projection system being configured to project the patterned radiation beam onto the sensor in a measurement phase and to project the patterned radiation beam onto a target portion of a substrate in an exposure phase, wherein the illumination system is configured to be switchable between providing the radiation beam with a first beam condition during the measurement phase and a second beam condition during the exposure phase, the second beam condition being different from the first beam condition.

According to an aspect of the invention, there is provided a device manufactured using the lithographic apparatus including: an illumination system configured to condition a radiation beam, a support constructed to support a patterning device, at least one of the support and the patterning device being capable of imparting the radiation beam with a pattern in its cross-section to form a patterned radiation beam, a sensor being capable to receive at least part of the patterned radiation beam and to provide a sensor output signal, and a projection system being configured to project the patterned radiation beam onto the sensor in a measurement phase and to project the patterned radiation beam onto a target portion of a substrate in an exposure phase, wherein the illumination system is configured to be switchable between providing the radiation beam with a first beam condition during the measurement phase and a second beam condition during the exposure phase, the second beam condition being different from the first beam condition.

According to an aspect of the invention, there is provided a patterning device including a wavefront sensing structure for use with a lithographic apparatus, the lithographic apparatus including an illumination system configured to condition a radiation beam, a support constructed to support a patterning device, at least one of the support and the patterning device being capable of imparting the radiation beam with a pattern in its cross-section to form a patterned radiation beam, a sensor being configured to receive at least part of the patterned radiation beam and to provide a sensor output signal, and a projection system being configured to project the patterned radiation beam onto the sensor in a measurement phase and to project the patterned radiation beam onto a target portion of a substrate in an exposure phase, wherein the illumination system is configured to be switchable between providing the radiation beam with a first beam condition during the measurement phase and a second beam condition during the exposure phase, the second beam condition being different from the first beam condition. In this aspect, the pattern includes a wavefront sensing structure, the projection system is arranged and construed to provide to the sensor, within the measurement phase, a wavefront of the patterned radiation beam formed by the wavefront sensing structure, and the sensor is a wavefront sensor arranged and construed to receive the wavefront, to determine a wavefront quality parameter of the wavefront, and to provide the sensor output signal in dependence on the wavefront quality parameter.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 1 depicts a lithographic apparatus according to an embodiment of the invention.

FIG. 2 schematically illustrates the transformation of an angular intensity distribution to a spatial intensity distribution according to a prior art arrangement.

FIG. 3 schematically illustrates in more detail part of the lithographic apparatus shown in FIG. 1.

FIGS. 4a-b schematically illustrate a mirror of a mirror array which may form part of the lithographic apparatus shown in FIG. 1.

Figure 14:
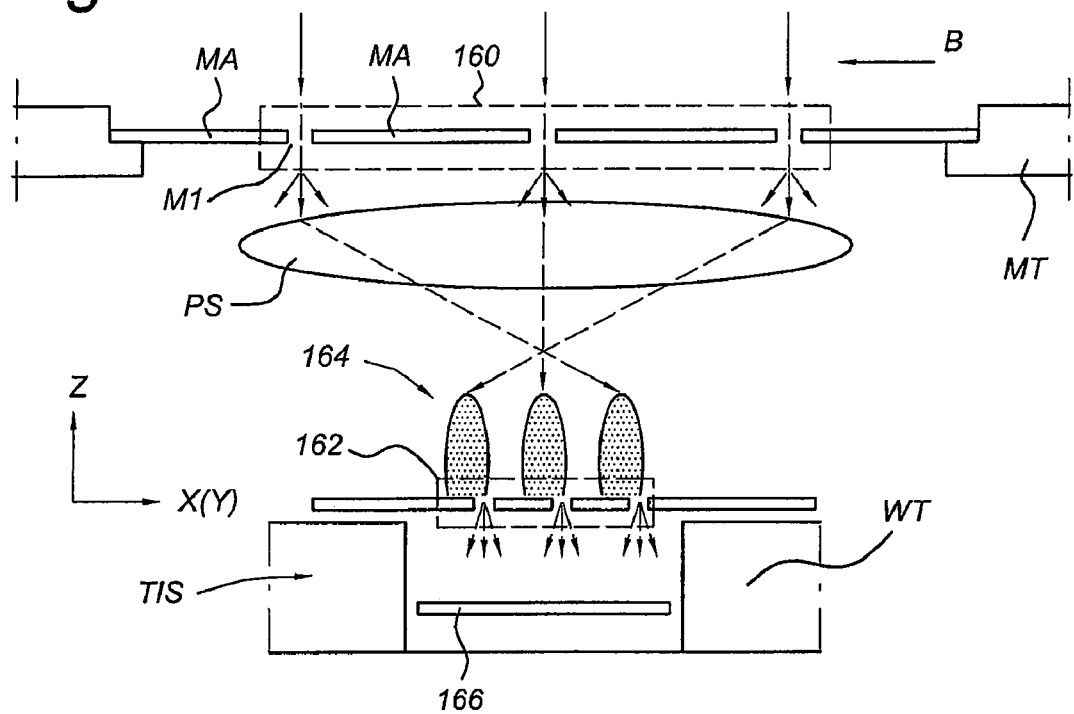

FIG. 14 schematically depicts a transmission image sensor arrangement according to an embodiment of the present invention.

Figure 15:
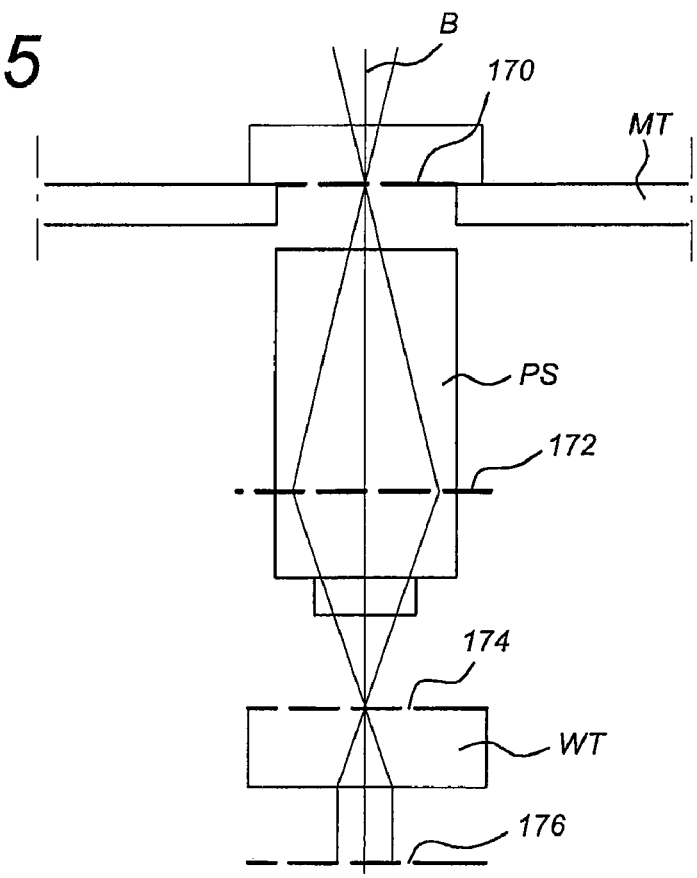

FIG. 15 schematically depicts an arrangement for an interferometric measurement according to an embodiment of the present invention.

Figure 16A:
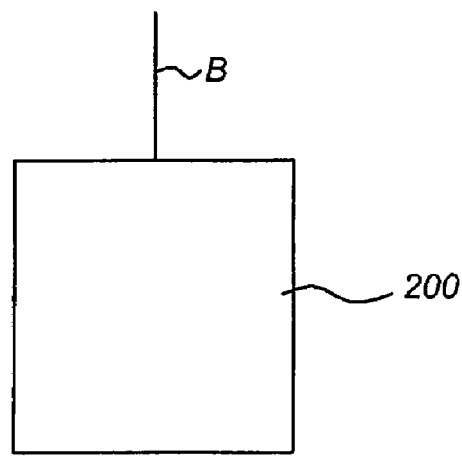
Figure 16B:
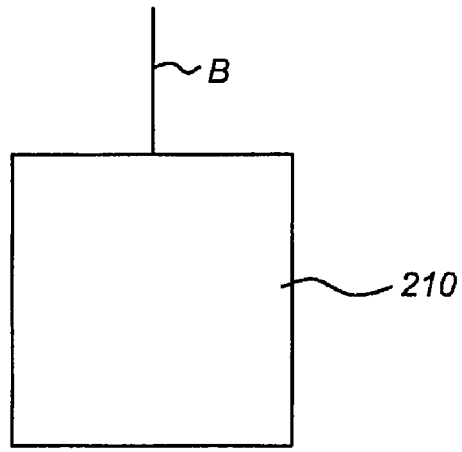
Figure 16C:
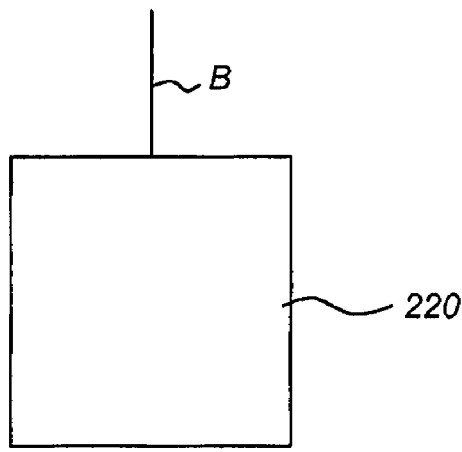

FIG. 16 schematically depicts arrangements for an interferometric sensor according to an embodiment of the present invention.

FIG. 17 depicts a method according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1:
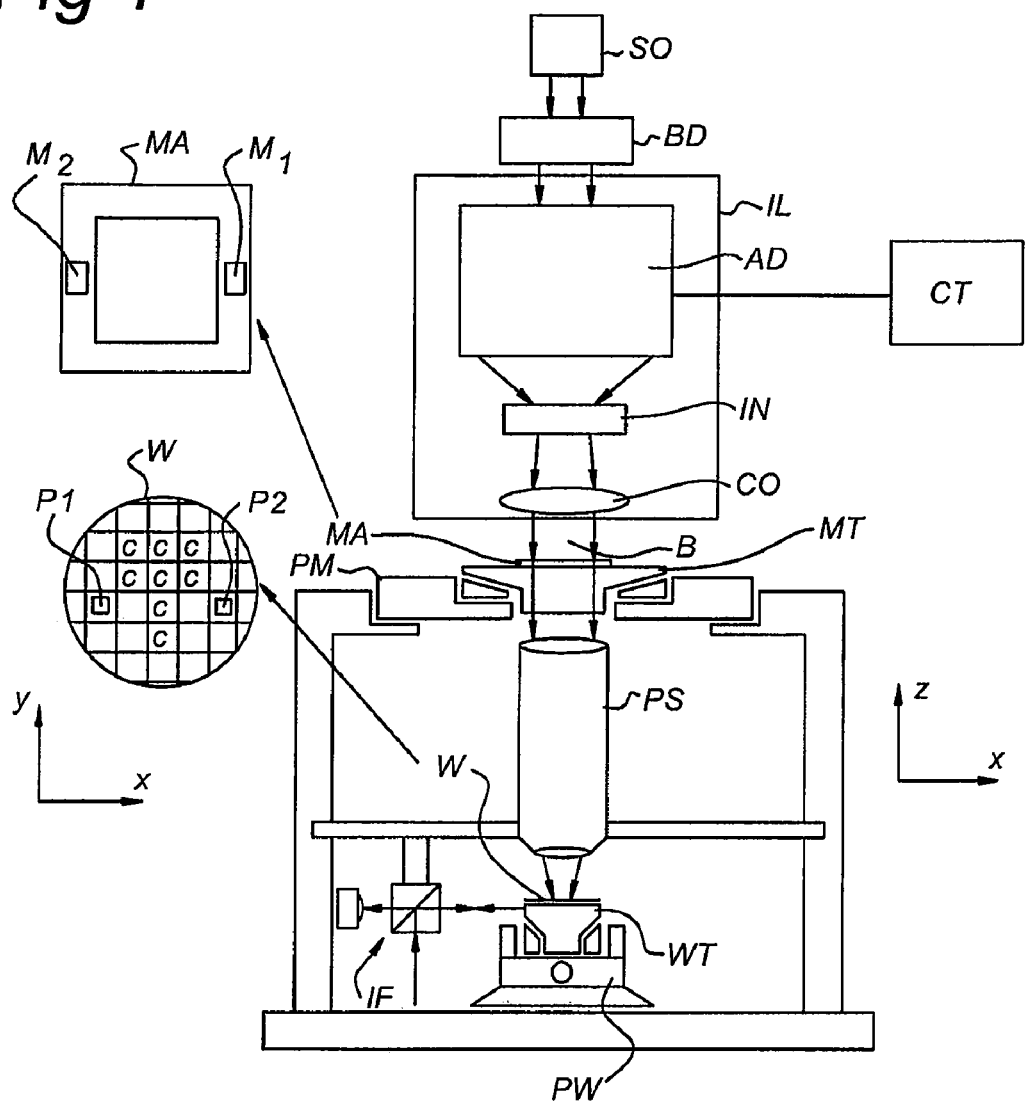

FIG. 1 schematically depicts a lithographic apparatus according to one embodiment of the invention. The apparatus includes:

- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to radiation beam B by patterning device MA onto a target portion C (e.g. including one or more dies) of substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system BD including, for example, suitable directing mirrors and/or a beam expander. In other cases the source may be an integral part of the lithographic apparatus, for example when the source is a mercury lamp. Source SO and illuminator IL, together with beam delivery system BD if required, may be referred to as a radiation system.

Illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may include various other components, such as an integrator IN and a condenser CO. The illuminator may be used to condition the radiation beam, to have a desired uniformity and intensity distribution in its cross-section.

Radiation beam B is incident on the patterning device (e.g., mask MA), which is held on the support structure (e.g., mask table MT), and is patterned by the patterning device. Having traversed mask MA, radiation beam B passes through projection system PS, which focuses the beam onto a target portion C of substrate W. With the aid of second positioner PW and position sensor IF (e.g. an interferometric device, linear encoder or capacitive sensor), substrate table WT can be moved accurately, e.g. so as to position different target portions C in the path of radiation beam B. Similarly, first positioner PM and another position sensor (which is not explicitly depicted in FIG. 1) can be used to accurately position mask MA with respect to the path of the radiation beam B, e.g. after mechanical retrieval from a mask library, or during a scan. In general, movement of mask table MT may be realized with the aid of a long-stroke module (coarse positioning) and a short-stroke module (fine positioning), which form part of first positioner PM. Similarly, movement of substrate table WT may be realized using a long-stroke module and a short-stroke module, which form part of second positioner PW. In the case of a stepper (as opposed to a scanner) mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on mask MA, the mask alignment marks may be located between the dies.

The depicted apparatus could be used in at least one of the following modes:

1. In step mode, mask table MT and substrate table WT are kept essentially stationary, while an entire pattern imparted to the radiation beam is projected onto a target portion C at one time (i.e. a single static exposure). Substrate table WT is then shifted in the X and/or Y direction so that a different target portion C can be exposed. In step mode, the maximum size of the exposure field limits the size of the target portion C imaged in a single static exposure.

2. In scan mode, mask table MT and substrate table WT are scanned synchronously while a pattern imparted to the radiation beam is projected onto a target portion C (i.e. a single dynamic exposure). The velocity and direction of substrate table WT relative to mask table MT may be determined by the (de-)magnification and image reversal characteristics of projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, mask table MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Beam Conditions

Illuminator IL may include an adjuster AD configured to adjust the angular intensity distribution of the radiation beam. This may allow adjustment of for example, the outer and/or inner radial extent (commonly referred to as σ-outer and σ-inner, respectively) of the intensity distribution in a pupil plane of the illuminator. In addition, illuminator IL generally includes various other components, such as an integrator IN and coupling optics CO. The integrator, which may for example be a quartz rod, improves the homogeneity of the radiation beam.

The spatial intensity distribution of the radiation beam at the illuminator pupil plane is converted to an angular intensity distribution before the radiation beam is incident upon patterning device (e.g. mask) MA. In other words, there is a Fourier relationship between the pupil plane of the illuminator and patterning device MA (the patterning device is in a field plane). This is because the illuminator pupil plane substantially coincides with the front focal plane of coupling optics CO, which focus the radiation beam to patterning device MA.

Control of the spatial intensity distribution at the pupil plane can be used to improve the accuracy with which an image of patterning device MA is projected onto a substrate W. In particular, spatial intensity distributions with dipole, annular or quadrupole off-axis illumination profiles may be used to enhance the resolution with which the pattern is projected, or to improve other parameters such as sensitivity to projection lens aberrations, exposure latitude and depth of focus.

Figure 2:
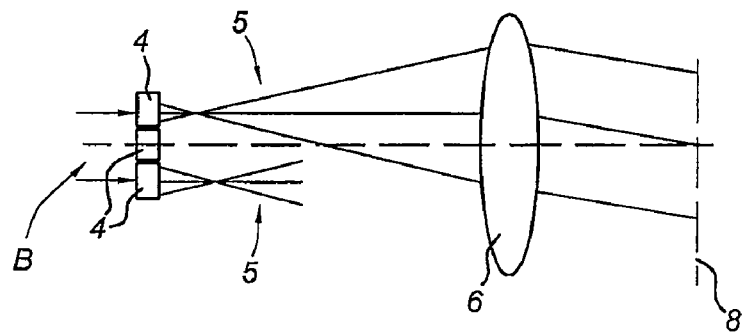

FIG. 2 schematically illustrates the principle of corresponding angular and spatial intensity distributions of a radiation beam B. According to a prior-art arrangement, the outer and/or inner radial extent of the radiation beam (σ-outer and σ-inner respectively) may be set using an array of diffractive elements 4. Each diffractive element 4 forms a divergent pencil 5 of rays. Each pencil 5 of rays corresponds to a part or sub-beam of radiation beam B. Pencils 5 will be incident at a focusing lens 6. In the back focal plane 8 of focusing lens 6, each pencil 5 corresponds to an illuminated area. The size of the area depends on the range of directions into which the rays of the pencil 5 propagate. If the range of directions is small, the size of the illuminated area in back focal plane 8 is also small. If the range of directions is large, the size of the illuminated area in back focal plane 8 is also large. Furthermore, all identical directions of pencils 5, i.e., all rays which are parallel to each other, correspond to the same particular point in back focal plane 8 (provided that ideal optical conditions apply).

It is known, for example, to produce a spatial intensity distribution in a cross-section of radiation beam B (in particular in a pupil plane of the radiation beam) which has an annular shape. This is known as an annular illumination mode. The inner radial extent (σ-inner) of the annular shape corresponds to the central area with an intensity of zero or close to zero, and can be set by using an appropriate array of diffractive optical elements. For example, referring to FIG. 2, an array of diffractive elements 4 can be selected which is configured such that none of pencils 5 of rays will be incident at the central area, and will instead only be incident in the annular area (although in practice, there may be an intensity greater than zero in the central area, due to effects such as dispersion). By appropriate selection of the diffractive element array 4, other spatial intensity distributions can be produced in the cross-sectional area, such as dipole or quadrupole illumination. Additional optical elements (not illustrated) such as a zoom lens or an axicon may be used to apply further modifications to the angular distribution of the radiation beam.

FIG. 3 schematically shows an alternative prior art arrangement, described in EP 1 262836 A1, incorporated by reference herein in its entirety. A source 30 (equivalent to SO in FIG. 1) outputs a relatively narrow, collimated radiation beam which passes through a shutter 31. It is then passed through beam divergence optics 32 which expand the beam to a size which corresponds to the size of an array 33 of reflective elements 33a, 33b, 33c, 33d, 33e. Ideally, the radiation beam divergence optics 32 should output a collimated beam. In an embodiment, the size of the expanded radiation beam is sufficient that the radiation beam is incident at all reflective elements 33a to 33e. In FIG. 3, by way of example, three sub-beams of the expanded radiation beam are shown.

A first sub-beam is incident at reflective element 33b. Like the other reflective elements 33a, 33c, 33d, 33e of array 33, reflective element 33b can be controlled to adjust its orientation so that the sub-beam is reflected in a desired predetermined direction. Redirecting optics 16, which may include a focusing lens, redirect the sub-beam so that it is incident at a desired point or small area in a cross-sectional plane 18 of the radiation beam. Cross-sectional plane 18 may coincide with a pupil plane, which acts as a virtual radiation source for other parts of the illuminator (not shown in FIG. 3). The other sub-beams shown in FIG. 3 are reflected by reflective elements 33c, 33d and redirected by redirecting optics 16 so as to be incident at other points of plane 18. By controlling the orientations of the reflective elements 33a to 33e, almost any spatial intensity distribution in cross-sectional plane 18 can be produced.

Although FIG. 3 shows only five reflective elements 33a-e, array 33 may include many more reflective elements, for example arranged in a two-dimensional grid. For example, array 33 may include 1024 (e.g. 32×32) mirrors, or 4096 (e.g. 64×64) mirrors, or any other suitable number of mirrors. More than one array of mirrors may be used. For example a group of four mirror arrays having 32×32 mirrors may be used. In the following text, the term 'array' may mean a single array or a group of mirror arrays.

The orientation of each mirror of array 33 may be adjusted separately. The orientations of the mirrors may be controlled by a controller CT (see FIG. 1).

FIGS. 4a-b show schematically an example of a reflective element, which may for example form part of the array of reflective elements shown schematically in FIG. 3. The array of reflective elements may include, for example, more than 1000 of such reflective elements, which may, for example, be arranged in a grid-like formation in a plane which crosses through a radiation beam. The reflective element shown in FIG. 4a-b is viewed from above in FIG. 4a and in a perspective view in FIG. 4b. For ease of illustration, some of the detail shown in FIG. 4a is not included in FIG. 4b. The reflective element includes a mirror 61 with a rectangular reflective surface area. In general, the mirror can have any desired shape, for example square, rectangular, circular, hexagonal, etc. Mirror 61 is connected to a support member 63 via a rotational connection 65. Mirror 61 may be rotated with respect to support member 63, the rotation being around a first axis X (indicated by a dashed line). Support member 63 is rotationally connected to legs 67 which are supported by a substrate (not shown). The support member may be rotated around a second axis Y (indicated by a dashed line). It is therefore possible to orientate mirror 61 in directions which require a combination of X-axis and Y-axis rotations.

The orientation of mirror 61 may be controlled using electrostatic actuators 71. Electrostatic actuators 71 include plates to which predetermined charges are applied. The charges attract mirror 61 via electrostatic attraction, and are varied to adjust the orientation of the mirror. Sensors may be provided to give feedback control of the orientation of mirror 61. The sensors may, for example, be optical sensors, or may, for example, be capacitive feedback sensors. The plates which are used as electrostatic actuators may also act as the capacitive feedback sensors. Although only two electrostatic actuators 71 are shown in FIGS. 4a-b, more than two may be used. Any other suitable form of actuator may be used. For example piezo-electric actuators may be used.

Measurement and Alignment

Figure 5:
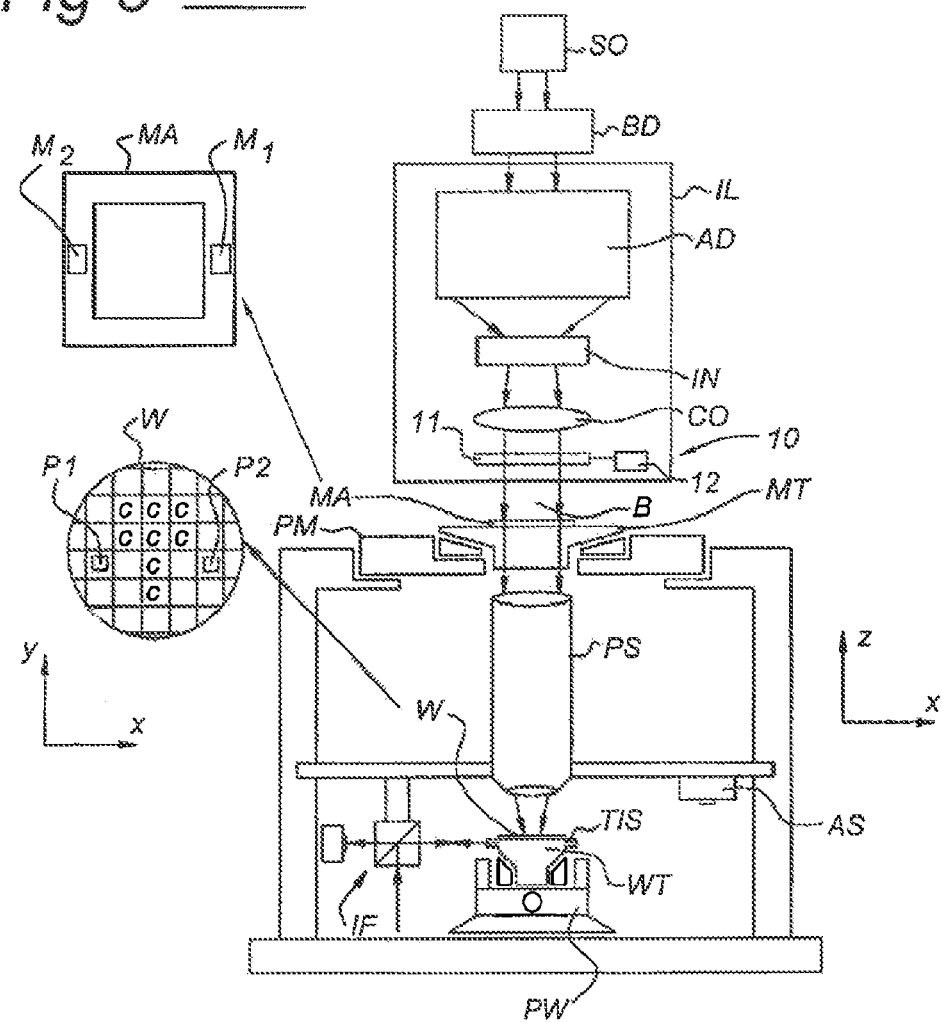
FIG. 5 depicts a lithographic apparatus according to a prior art arrangement.

FIG. 5 schematically depicts a known lithographic apparatus. The known lithographic apparatus includes similar components as the components described in reference to FIG. 1. The same reference symbols are used for similar components, although the actual components and their functioning may be different.

Figure 6:
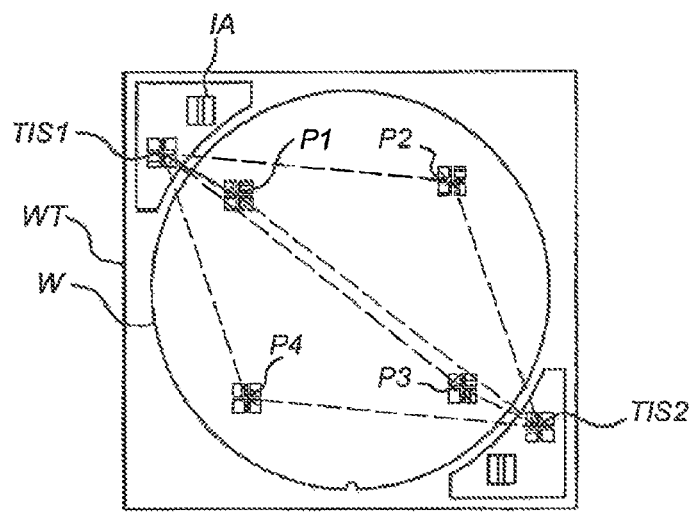
FIG. 6 depicts the substrate stage of the apparatus of FIG. 5.

The known apparatus also includes an alignment sensor AS, which may be mounted at the measurement station of a dual stage apparatus, which is used to detect alignment markers printed on a substrate W and also fixed markers (fiducials) provided on the substrate table. This can be seen in FIG. 6, which shows four alignment markers P1-P4 printed on the substrate and two fixed markers TIS1 and TIS2 provided on substrate table WT. The substrate table may also have on it a sensor IA for an interferometric system that measures properties of the projection system, e.g. aberrations, and sensors for other systems that involve detection of a property of an image projected by projection system PS. By scanning substrate table WT under alignment sensor AS whilst keeping track of its movements using displacement measurement system IF, the positions, shown by dashed arrows, of substrate markers P1-P4 relative to fixed markers TIS1, TIS2 can be determined.

Fixed markers TIS1 and TIS2 have integrated into them an image sensor that can be used to determine the location of an image of a mask marker by scanning the image sensor through the aerial image. Thus the relative position of the image of the mask marker and the fixed markers can be determined and the previously obtained relative positions of the substrate markers allow the substrate to be positioned at any desired position relative to the projected image with great accuracy.

Figure 7:
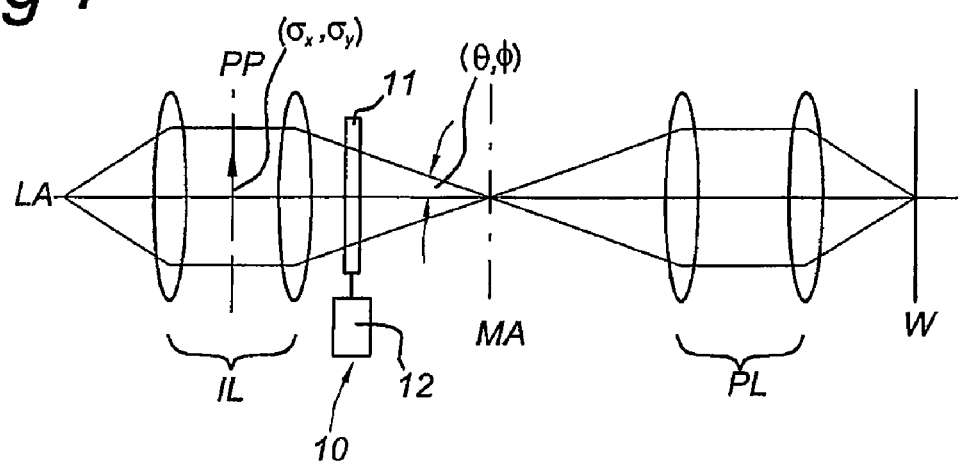
FIG. 7 depicts the optical arrangements of the apparatus of FIG. 5.

One factor that influences the projected image of a mask pattern is the illumination profile of the mask, that is, the angles from which radiation is incident on the mask. Most lithographic apparatus use the well-known Kohler illumination arrangement, which is illustrated schematically in FIG. 7. In such an arrangement, there is a plane, referred to as a pupil plane PP, (and sometimes multiple planes) in illumination system IL that is a Fourier transform of the object plane of projection system PS, in which mask MA is located. As is well known, position in the pupil plane (expressed using normalized variables σ-x and σ-y) translates to angle (θ, φ) at the object plane so that the angular distribution of the illumination of the mask can be determined by defining an intensity distribution in the pupil plane. A variety of devices can be used to define the intensity distribution in the pupil plane, including zoom lenses, axicons, zoom-axicons, diffractive optical elements, masking blades and aperture plates.

Illumination profiles are commonly referred to by the shape of the intensity distribution in the pupil plane and include: conventional illumination (defined by a pupil filling factor often referred to as a σ-setting), annular illumination (defined by inner and outer radii, often referred to as σ-i and σ-o or σ-inner and σ-outer), dipole illumination and quadrupole illumination, as well as combinations of these and more complex distributions. A lithographic apparatus may be provided with devices to define standard illumination profiles, with or without adjustable parameters, that are suitable for imaging common patterns, or devices to define custom illumination profiles for specific patterns. The lithographic apparatus may have one or more devices to control or adjust the illumination profile.

Figure 8:
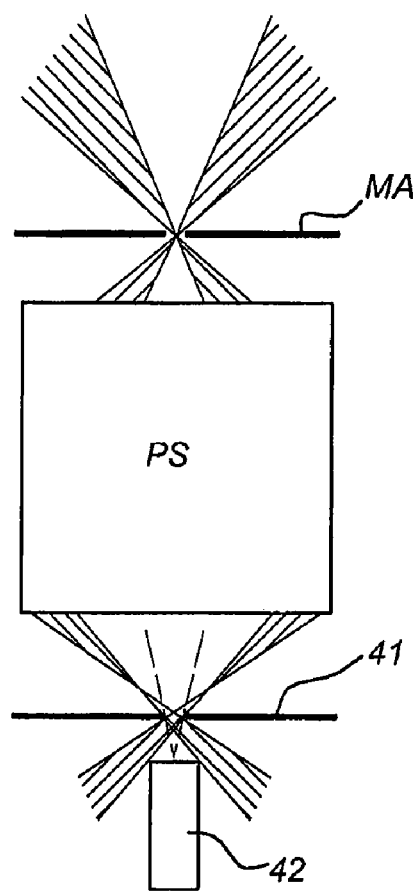
FIG. 8 and FIG. 9 depict coupling of radiation into a sensor at substrate level without and with a diffuser positioned in the path of the projection beam in the apparatus of FIG. 5.

If the illumination mode used is one in which most of the radiation is incident on the mask at large angles of incidence, for example an annular illumination mode with a large σ-i value or a dipole or quadrupole mode with poles close to the edge of the pupil plane, it may be that little or no radiation is coupled into a transducer 42, as shown in FIG. 8. This can result in a low signal to noise ratio and other effects that reduce the accuracy of the resulting measurement. A reduction of accuracy can also occur even when sufficient radiation is coupled in to the transducer if the sensitivity of the transducer is not uniform with angle of incidence. In essence, a mismatch between the illumination mode and the acceptance NA of the sensor can lead to inaccuracies. This problem is exacerbated in that the reducing magnification (e.g. ¼ or ⅕) of the projection lens increases angles of incidence at the substrate level.

Figure 9:
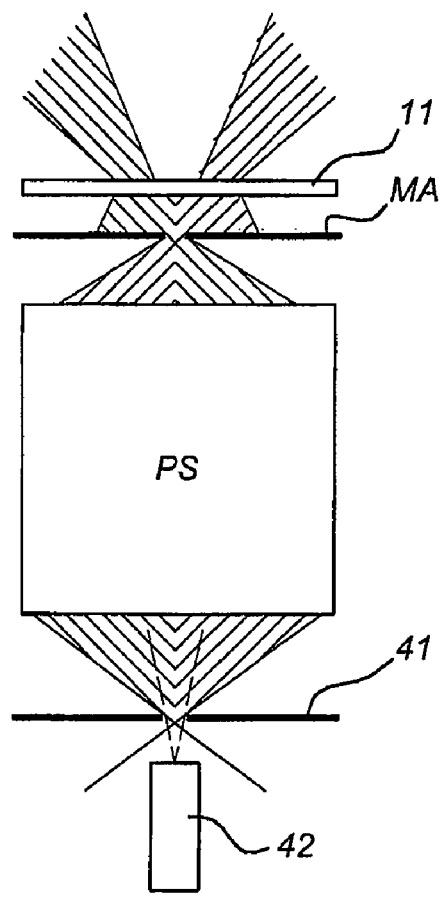

In the prior art approach, a diffuser module 10 (FIG. 5) is provided in illumination system IL. This includes a diffuser 11 and an actuator system 12 by which the diffuser can be inserted into and removed from the path of the projection beam. As shown in FIG. 9, the effect of diffuser 11 is to increase the range of angles at which radiation is incident onto the mask and hence onto sensor 41, 42. This can ensure both that sufficient radiation is coupled into the sensor and that there is sufficient uniformity of angle of incidence to mitigate the effect of any angle sensitivity of the sensor.

It may be a disadvantage of the known apparatus and the known method that the movement of diffuser 11 into and out of the beam requires some time to complete. The inventors have invented an alternative, faster method. Moreover, the movement may result in disturbances, e.g. to mechanical vibrations. The inventors have invented an alternative device which can be operated with little or no mechanical influence on its environment.

It is may be further a disadvantage of the known apparatus and the known method that the diffuser is not suitable for use with any possible illumination mode. Also, as the required form of the diffuser will depend on the degree and nature of between the mismatch between the illumination mode and the sensor acceptance range, it may be needed to use a diffuser of a form that is not available. Moreover, the effect of the diffuser is limited to increasing the range of angles of radiation. It may, however, be useful not to increase the range of angles, but to rearrange the intensity distribution within the same range of angles, or to decrease the range of angles as to concentrate the radiation of the illumination beam in a narrower angle. The inventors have invented an alternative, more versatile device which can be used with substantially any possible practical illumination mode.

Also, the resulting diffuse beam may not be compatible with a measurement and/or alignment system of the lithographic apparatus. For example, a diffuse beam may conflict with performing an interferometric measurement on the beam quality or using an interferometric alignment method. The inventors have invented an alternative, more versatile device which can be used with a wide variety of measurement and alignment systems.

In an embodiment of the present invention, a device manufacturing method for projecting a patterned beam of radiation onto a substrate includes a measurement phase and an exposure phase. In the measurement phase, the method includes conditioning a radiation beam with a first beam condition, forming the patterned radiation beam by imparting the radiation beam with the first beam condition with a first pattern in its cross-section, and projecting the patterned beam onto a sensor capable of providing a sensor output signal. In the exposure phase, the method includes switching the conditioning of the radiation beam to a second beam condition, the second beam condition being different from the first beam condition, and forming the patterned radiation beam by imparting the radiation beam with the second beam condition with a second pattern in its cross-section, the second pattern being provided by a patterning device; projecting the patterned beam onto a target portion of the substrate.

Switching the conditioning of the radiation beam rather than re-adjusting the illumination system by re-adjustment of, e.g., a position of a diffuser in the radiation beam, has the advantage that it is much more flexible in the sense of, e.g., being applicable for a wider range of illumination modes and/or measurement methods and/or alignment methods.

Switching the conditioning of the radiation beam may also mitigate one or more of the other problems of the known systems.

The method may be applied in the lithographic apparatus described above in reference with FIG. 1, the lithographic apparatus including: an illumination system IL configured to condition a radiation beam B; a support MT constructed to support a patterning device MA, at least one of the support and the patterning device being capable of imparting the radiation beam with a pattern in its cross-section to form a patterned radiation beam; a sensor TIS 176 (FIG. 15) being capable to receive at least part of the patterned radiation beam and to provide a sensor output signal; and a projection system PS being configured to project the patterned radiation beam onto the sensor in a measurement phase, and to project the patterned radiation beam onto a target portion of a substrate W in an exposure phase; wherein illumination system IL is configured to be switchable between providing radiation beam B with a first beam condition during the measurement phase and a second beam condition during the exposure phase, the second beam condition being different from the first beam condition.

In an embodiment, the second beam condition is derived in dependence on at least a parameter derived from the sensor output signal.

The parameter may be, e.g., a beam quality parameter, such as a focus quality or another type of optical aberration. The second beam condition may then be adjusted so as to provide corrections to the radiation beam for obtaining an improved beam quality. Dynamical variations of illumination system IL or projection system PS, such as optical aberrations due to temperature effects as heating of the lenses or e.g. expansion of mechanical connections between optical components in the optical system, may be measured during the measurement phase and compensated for during the exposure phase by applying adjustments to the radiation beam, derived from the sensor output signal as acquired in the measurement phase. The measurement phase may be repeated with an adjusted radiation beam, e.g. to allow a confirmation of the achieved effect on the optical quality of the radiation beam.

The parameter may be, e.g., an alignment quality parameter, such as the required settings of first positioner PM and second positioner PW required for an optimal alignment between the mask and the wafer. The second beam condition may then relate to a correction between the relative position of the mask and the wafer.

In an embodiment, illumination system IL is configured to be switchable between providing radiation beam B with the first beam condition and providing the radiation beam with the second beam condition within a time period of 1 seconds. In further embodiments, the time period may be, for example and without limitation, 0.5 seconds, 50 ms, or even 5 ms.

As all time spent for measurement cannot be used for exposure of a substrate, such a fast switching allows an economical and efficient use of the lithographic apparatus with a high throughput.

In an embodiment, for providing radiation beam B with the first beam condition and the second beam condition, illumination system IL includes a switchable radiation beam conditioner 33.

Radiation beam conditioner 33 may be switchable between a low number of resulting radiation beam conditions. The radiation beam conditioner may be switchable between a large number of resulting radiation beam conditions, and be configurable to provide substantially any useful practical beam condition for measurement as well as for exposure. The radiation beam conditioner can thus be more versatilely applied than the known diffuser method.

In an embodiment, the illumination system includes a steering device 33 for being switchable between providing the radiation beam with the first beam condition and providing the radiation beam with the second beam condition, the steering device being constructed and arranged to individually steer different parts of the radiation beam into different directions to provide a desired angular intensity distribution of the radiation beam at the patterning device, the steering device including a plurality of discrete reflectors 33a, 33b, 33c, 33d, 33e, each for steering a part of the radiation beam, and whose orientation can be controlled individually to direct the corresponding part of the radiation beam into a desired direction.

In an alternative embodiment, the steering device includes a plurality of directing elements transmitting different sub-beams of an incident projection beam into adjustable, individually controllable directions.

In several embodiments, switchable radiation beam 33 conditioner may include, or cooperate with, re-directing elements 16 to re-direct at least a part of the steered radiation beam and to produce a spatial intensity distribution in a cross-section 18 of the radiation beam which corresponds to the angular intensity distribution.

The cross-section may be a pupil plane.

By use of re-directing optics, any desired spatial intensity distribution of radiation beam B can be produced in its cross-sectional plane.

The switchable radiation beam conditioner may further also be referred to as a fast switchable illuminator, referring to the characteristic that the switchable radiation beam conditioner can change from one illumination mode to another illumination mode much faster than may be achieved by moving a diffuser into or out of the beam. The fast switchable illuminator may be arranged and construed to change within, for example, about 0.5 seconds. In an embodiment, the fast switchable illuminator is arranged and construed to change from any one illumination mode to any other illumination mode within, for example, about 50 msec. In a further embodiment, the fast switchable illuminator is arranged and construed to change from any one illumination mode to any other illumination mode within, for example, about 5 msec.

Figure 10A:
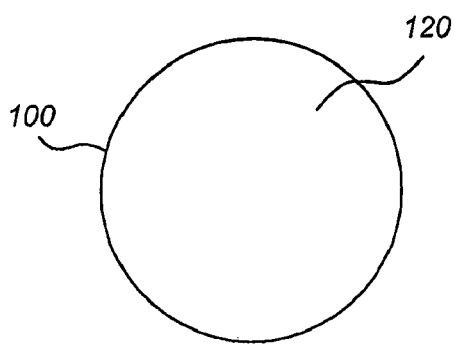
FIG. 10-FIG. 13 depict exemplary spatial intensity distributions in a pupil plane, according to embodiments of the present invention.
Figure 10B:
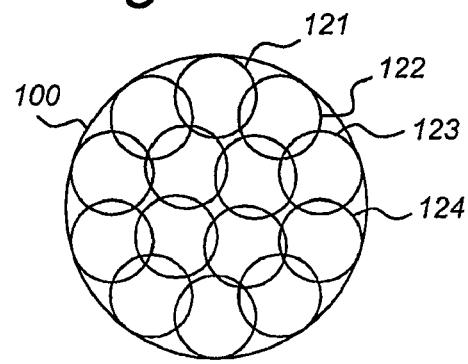

Fast switchable illuminator 33 may be arranged and construed to provide a beam condition for illumination during a measurement phase with an measurement beam condition of substantially any intensity distribution in the pupil, e.g. a uniformly filled pupil, as shown in FIGS. 10a and 10b. The measurement phase may include an alignment phase, during which a sensor is illuminated, as will be described below.

Figure 13A:
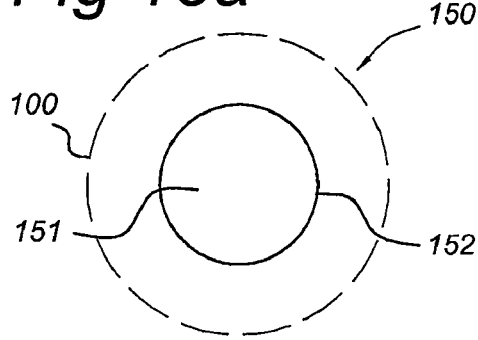

FIG. 10a,b-FIG. 13a,b show spatial intensity distributions in a pupil plane which may be produced by the illuminator of the lithographic apparatus. The figures may be understood as schematic diagrams which illustrate the principle of producing a spatial intensity distribution using a plurality of sub-beams. Since the sub-beams of the radiation beam can be directed to any desired place of the cross-sectional area, almost any intensity profile can be produced. However, it is also possible to produce what could be considered to be conventional intensity distributions, e.g. with an annular shape, with a dipole shape, quadrupole shape, etc.

FIG. 10a shows a pupil 100 which is completely filled over its full cross section 120. A complete filling refers to a situation in which the whole cross section 120 carries some amount of light. The complete filling may be a substantially uniform filling. A substantially uniform filling refers to a situation in which the whole cross section 120 carries an amount of light which is substantially larger than 70% of the maximum amount of light in the cross section at substantially every position in the cross section. FIG. 10b shows how the flexible illuminator may fill up the entire cross section 120 of pupil 100 by a plurality of overlapping sub-beams, of which several have been indicated with reference numbers 121, 122, 123, 124.

The fast switchable illuminator may be arranged and construed to provide a beam condition for illumination during an exposure phase with an exposure beam condition of substantially any intensity distribution in the pupil, e.g. a Gaussian distribution, a distribution with a cutoff, an annular ring-like distribution, a dipole distribution or a quadrupole distribution. The fast switchable illuminator may be arranged and construed to provide a sequence of beam conditions for illumination during an exposure phase, e.g. a Gaussian distribution during a first fraction of the exposure phase and an annular distribution during a second fraction of the exposure phase.

Figure 11A:
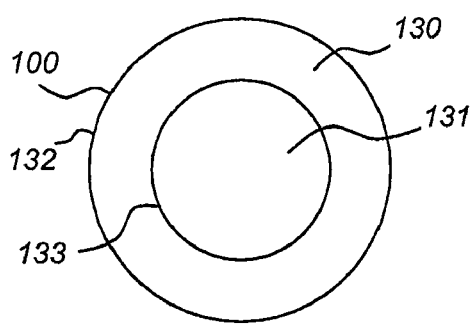
Figure 11B:
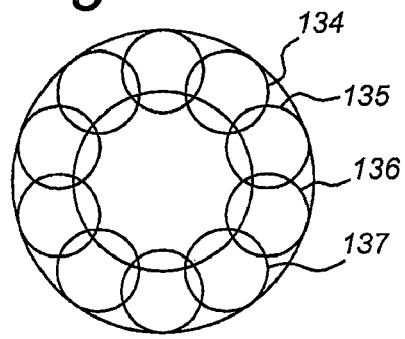

FIG. 11a shows an example of an annular filling of pupil 100 that may be used as the illumination mode during the exposure phase. The pupil is filled between an outer radius 132, corresponding to the outer radius of pupil 100 in this example, and an inner radius 133. A ring 130 is thus filled with light, whereas a central area 131 of the pupil is dark. FIG. 11b shows how the flexible illuminator may fill up ring 130 of pupil 100 by a plurality of overlapping sub-beams, of which several have been indicated with reference numbers 134, 135, 136, 137. The outer and inner radii can be adjusted by directing the sub-beams to the corresponding places between the inner circle and the outer circle.

Figure 12A:
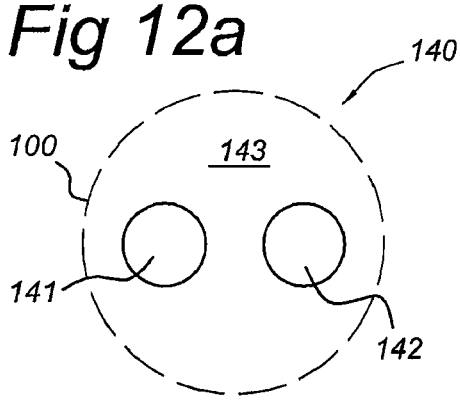
Figure 12B:
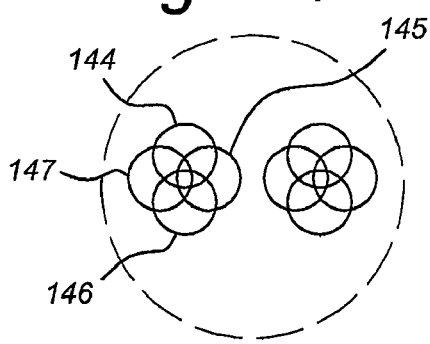

FIG. 12a shows an example of a dipole distribution 140 in pupil 100 that may alternatively be used as the illumination mode during the exposure phase. The pupil is filled in two circular regions 141, 142, whereas the rest 143 of the pupil is dark. FIG. 12b shows how the flexible illuminator may fill up circular regions 141, 142 of pupil 100 by a plurality of overlapping sub-beams, of which several have been indicated with reference numbers 144, 145, 146, 147.

Figure 13B:
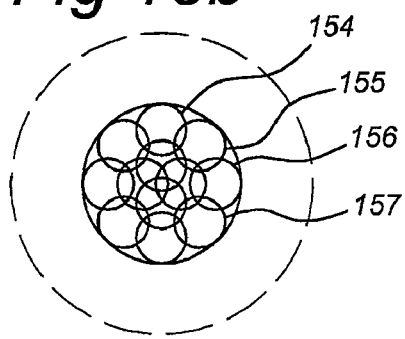

FIG. 13a shows an example of a low-NA filling 150 of pupil 100 that may be used as the illumination mode during the exposure phase. The pupil is filled within an NA-limiting radius 152, smaller than the outer radius of pupil 100 in this example, and is dark outside. FIG. 13b shows how the flexible illuminator may fill up low-NA area 151 of pupil 100 by a plurality of overlapping sub-beams, of which several have been indicated with reference numbers 154, 155, 156, 157. Such a low-NA filling of the pupil may be useful when structures with relatively large dimensions need to be exposed.

In the examples shown, the sub-beams correspond to a circular area in the pupil plane. However, the sub-beams may have an alternative shape. Also, the sub-beams may be composed of a plurality of sub-sub-beams.

In embodiments of the invention, the pattern includes an alignment mark, the projection system is arranged and construed to provide to the sensor, within the measurement phase, an aerial image of the alignment mark, and the sensor is a pattern matching sensor including a sensor match pattern and arranged and construed to receive the aerial image, to determine a match between the sensor match pattern and the aerial image, and to provide the sensor output signal in dependence on the match between the sensor match pattern and the aerial image.

An example according to an embodiment of the present invention is shown in FIG. 14, showing a Transmission Image Sensor TIS connected to wafer table WT, and arranged and construed to receive an aerial image 164 in the measurement phase. Aerial image 164 is produced by projection lens PS of a pattern 160 provided in an alignment mark M1 in reticle MA or in reticle stage MT. By correlating and matching aerial image 164 with a TIS pattern 162 provided to the TIS sensor during a movement of the wafer table in the horizontal X and Y direction as well as in the vertical Z direction, an X, Y, Z position may be found in which aerial image 164 matches pattern 162, e.g., by detecting a maximum amplitude level of the signal of a photo sensor 166 located below TIS pattern 162. At this X, Y, Z position, the alignment of the wafer table with respect to the reticle or reticle stage is adequate and the magnification of the projection system is adequate.

Pattern 160 in alignment mark M1 may include, e.g., a grating including lines with a grating line width spaced at a grating period, and the TIS sensor may include a corresponding TIS grating pattern 162 at, e.g., ¼ or ⅕ of the size of pattern 160 in alignment mark M1.

The measurement beam condition may correspond to a uniformly filled pupil while performing the TIS alignment, i.e., a pupil with a uniformity of the filling of the pupil of at least 70%, as described above. The TIS sensor is arranged and construed to provide a sensor output signal in dependence on the match between the sensor match pattern and the aerial image.

In an embodiment, the pattern includes a wavefront sensing structure, the projection system is arranged and construed to provide to the sensor, within the measurement phase, a wavefront of the patterned radiation beam formed by the wavefront sensing structure, and the sensor is a wavefront sensor arranged and construed to receive the wavefront, to determine a wavefront quality parameter of the wavefront, and to provide the sensor output signal in dependence on the wavefront quality parameter.

FIG. 15 shows an example of such a sensor arrangement, according to an embodiment of the present invention. The projection system is arranged and construed to provide to the sensor a wavefront of the patterned radiation beam formed by a wavefront sensing structure in the reticle or in the reticle stage. The sensor may be, e.g., an Interferometic Sensor arranged and construed to receive the wavefront, to determine a wavefront quality parameter of the wavefront and to provide a sensor output signal in dependence on the wavefront quality parameter. This arrangement allows applying wavefront sensing structures in the reticle. The Interferometric Sensor may include, e.g., one of the exemplary arrangements shown in FIGS. 16a-16c:

a shear interferometer 200 arranged and construed to determine the wavefront quality using shear interferometry;
a point diffraction interferometer 210 arranged and construed to determine the wavefront quality using point diffraction interferometry; and
a hartman-shack wavefront sensor 220 arranged and construed to determine the wavefront quality using hartman-shack sensing.

An example of an Interferometric Sensor and its use is described in Mark van de Kerkhof et al, "Full optical column characterization of DUV lithographic projection tools", in Proceedings of the SPIE, Volume 5377, pp. 1960-1970 (2004), incorporated by reference herein in its entirety. The paper describes a phase measurement interferometer hardware named ILIAS™, which is an acronym for Integrated Lens Interferometer At Scanner. ILIAS is arranged as a common path interferometer, so no secondary reference beam is required. As shown in FIG. 15, in a lithographic tool employing Koehler illumination, a conjugate image of illuminator profile 170 is formed in pupil plane 172 of the projection lens. Since ILIAS camera 176 in turn is also conjugate with lens pupil 172, ILIAS can be used directly as a measurement for both the pupil transmission and the illumination profile. ILIAS employs lateral shearing interferometry to measure and analyze wavefront aberrations across the full image field with high accuracy and speed by acquiring wavefront aberrations in terms of Zernike polynomials. Lateral shearing interferometry includes splitting the wavefront using a wavefront sensing structure at the image plane, i.e. wafer level 170, into multiple wavefronts, which are laterally displaced. The wavefront sensing structure may be a grating arranged for providing a +1 and −1 order refraction beam without a significant higher order component. The laterally displaced wavefronts mutually interfere. The resulting interference pattern is recorded at detector 176, which is conjugate with lens pupil plane 172. The acquired wavefront aberrations may be used to adjust the illumination beam condition, e.g. an acquired defocus component may be used to determine a focus correction for projection system PS for obtaining an optimal focus position. Also other aberrations, e.g. corresponding to tilt or higher order aberrations, may be corrected by adjust the illumination beam condition. Beam adjuster AD may be arranged and construed to make such an adjustment by adjustable optics or by changing between a variety of optical components. For a wide range of corrections, the adjustment may also be performed using the fast switchable illuminator.

In another alternative sensor arrangement, the sensor includes a leveling sensor arranged and construed to determine a height of the substrate or of areas on the substrate table. A surface of which the height is to be measured is brought in a reference position and is illuminated with a measurement beam of radiation. The measurement beam of radiation impinges on the surface to be measured under an angle which is less than 90 degrees. Because the angle of incidence is equal to the angle of reflection, the measurement beam of radiation is reflected back from the surface with the same angle to form a reflected beam of radiation. The measurement beam of radiation and the reflected beam of radiation define a measurement plane. The level sensor measures the position of the reflected beam of radiation in the measurement plane. If the surface is moved in the direction of the measurement beam of radiation and another measurement is done, the reflected beam of radiation is reflected in the same direction as before. However, the position of the reflected beam of radiation has shifted the same way the surface has been moved. Prior art systems use a leveling sensor with a secondary measurement beam. The method according to an embodiment of the invention allows use of the illumination beam, e.g., by switching to a very low σ during the measurement phase and impinge the surface to be measured with the resulting narrow beam.

FIG. 17 shows a flow diagram of a method according to an embodiment of the invention. After a start 200, the method optionally determines measurement settings 201 associated with providing the measurement beam condition. The determination may be dependent on, e.g., characteristics of the sensor being used in the measurement, and, e.g., a determination of settings of first positioner PM and/or second positioner PW in order to provide the measurement beam condition so as to scan the image of a TIS mark over a TIS sensor, as described above in reference to FIG. 16. The determination of the measurement settings 201 may be skipped when the lithographic apparatus is arranged to be operated with fixed pre-determined measurement settings. In stage 202, the method sets a measurement beam condition using the fast switchable illuminator, e.g., as described with reference to FIG. 10a. In a next stage 203, a parameter related to the operation of the lithographic apparatus is measured while the apparatus is operated with a radiation beam with the measurement beam condition. The measurement may include a measurement of, e.g., the beam quality, or the relative positioning between the reticle or reticle stage and the wafer or wafer stage. At a first test point 204, a check is performed whether the measurement was done correctly and/or needs confirmation, or needs to be repeated with adjusted settings of the lithographic apparatus, e.g. which adjustments must be made to first positioner PM and/or second positioner PW in driving the position of the mask and the reticle. If the measurement was done correctly and does not require confirmation, the method continues with stage 206. If not, the method returns to stage 201, after determining adjusted measurement settings in stage 205, e.g., determining which adjustments must be made to first positioner PM and/or second positioner PW.

In stage 206, the method optionally determines exposure settings associated with providing an exposure beam condition. The exposure settings may, e.g., be dependent on at least a parameter derived from the measurement in 203 or on the type of mask being used for exposure. A focus condition may, e.g., be derived from the interferometric measurement and analysis of the wavefront or an alignment condition may, e.g., be derived from the TIS measurement. In stage 207, the beam conditions are set for the exposure beam at the exposure beam condition. In stage 208, the wafer is exposed with the appropriate beam conditions while the wafer and reticle are well aligned. At a next test point 209, a check is performed whether another exposure needs to be performed with the same reticle or not. If another exposure needs to be performed, the method returns to stage 206 after, if needed, determining 210 adjusted exposure settings for the other exposure. If no further exposure needs to be performed with the same reticle on the same wafer or the same wafer position, the method is completed 211. The lithographic apparatus may then, e.g. continue to another position on the wafer, another position on the reticle, another wafer or another reticle, whereafter the method may start again.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A device manufacturing method for projecting a patterned beam of radiation onto a substrate, comprising:
   in a measurement phase:
      steering different parts of a radiation beam individually into different directions to form a first conditioned beam from a first beam condition to provide a desired angular intensity distribution of the radiation beam at a patterning device,
      patterning the first conditioned beam with a first pattern in its cross-section to form a first patterned beam, the first pattern being provided by the patterning device, and
      projecting the first patterned beam onto a sensor capable of providing a sensor output signal; and
   in an exposure phase:
      steering the different parts of the radiation beam individually into different directions to form a second conditioned beam from a second beam condition to provide a desired angular intensity distribution of the radiation beam at the patterning device, the second beam condition being different from the first beam condition,
      patterning the second conditioned beam with a second pattern to form a second patterned beam, different from the first pattern, in its cross-section, the second pattern being provided by the patterning device, and projecting the second patterned beam onto a target portion of the substrate.

2. A device manufacturing method according to claim 1, further comprising:
providing the sensor output signal from the sensor;
deriving a parameter from the sensor output signal; and
deriving the second beam condition from at least the parameter derived from the sensor output signal.

3. A device manufacturing method according to claim 1, wherein the steering the different parts of the radiation beam individually into different directions is performed within a time period of 1 second.

4. A device manufacturing method according to claim 1, wherein, for steering the different parts of the radiation beam individually into different directions, each of a plurality of discrete reflectors is steering a part of the radiation beam, and the orientation of each of the plurality of discrete reflectors is individually controlled to direct the corresponding part of the radiation beam into a desired direction.

5. A device manufacturing method according to claim 4, wherein re-directing elements are re-directing at least a part of the steered radiation beam for producing a spatial intensity distribution in a cross-section of the radiation beam which corresponds to the angular intensity distribution.

6. A device manufacturing method according to claim 5, wherein the cross-section is a pupil plane.

7. A device manufacturing method according to claim 6, wherein the steering the different parts of the radiation beam individually into different directions to form the first conditioned beam from the first beam condition comprises filling the pupil.

8. A device manufacturing method according to claim 7, wherein the filling the pupil comprises filling the pupil with a uniformity of at least 70%.

9. A device manufacturing method according to claim 6, wherein the steering the different parts of the radiation beam individually into different directions to form the second conditioned beam from the second beam condition comprises providing the pupil with an intensity distribution selected from the group consisting of an annular distribution, a distribution with at least two poles, a dipole distribution, a quadrupole distribution and a circular low-NA distribution.

10. A device manufacturing method according to claim 1, wherein:
an aerial image of the first pattern is provided to the sensor within the measurement phase;
a match is determined between a sensor match pattern and the aerial image; and
the sensor output signal is provided based, at least in part, on the match between the sensor match pattern and the aerial image.

11. A device manufacturing method according to claim 10, wherein the first pattern is provided by an alignment mark.

12. A device manufacturing method according to claim 1, wherein:
a wavefront of the first patterned beam is provided to the sensor within the measurement phase,
a wavefront quality parameter of the wavefront is determined, and
the sensor output signal is provided at least in part based on the wavefront quality parameter.

13. A device manufacturing method according to claim 12, wherein:
the first pattern comprises a wavefront sensing structure, and
the wavefront of the first patterned beam is formed by the wavefront sensing structure.

14. A lithographic apparatus comprising:
an illumination system configured to condition a radiation beam;
a support constructed to support a patterning device, at least one of the support and the patterning device constructed and arranged to impart the radiation beam with a pattern in its cross-section to form a patterned radiation beam;
a sensor constructed and arranged to receive at least part of the patterned radiation beam and to provide a sensor output signal; and
a projection system configured to project the patterned radiation beam onto the sensor in a measurement phase, and to project the patterned radiation beam onto a target portion of a substrate in an exposure phase;
wherein
the illumination system comprises a steering device switchable between a first beam condition to form a first conditioned beam during the measurement phase and a second beam condition to form a second conditioned beam during the exposure phase, the steering device being constructed and arranged to individually steer different parts of the radiation beam into different directions to provide a desired angular intensity distribution of the radiation beam at the patterning device; and
wherein
the second beam condition is different from the first beam condition.

15. The lithographic apparatus according to claim 14, wherein
the second beam condition is derived in dependence on at least a parameter derived from the sensor output signal.

16. The lithographic apparatus according to claim 14, wherein:
the illumination system is configured to be switchable between providing the first conditioned beam and providing the second conditioned beam within a time period of 1 second.

17. The lithographic apparatus according to claim 14, wherein:
the steering device comprises a plurality of discrete reflectors, each for steering a part of the radiation beam, and whose orientation can be controlled individually to direct the corresponding part of the radiation beam into a desired direction.

18. The lithographic apparatus according to claim 17, wherein:
the steering device comprises re-directing elements to re-direct at least a part of the steered radiation beam and to produce a spatial intensity distribution in a cross-section of the radiation beam which corresponds to the angular intensity distribution.

19. The lithographic apparatus according to claim 18, wherein the cross-section is a pupil plane.

20. The lithographic apparatus according to claim 19, wherein using the first beam condition to form the first conditioned beam comprises filling the pupil.

21. The lithographic apparatus according to claim 20, wherein the filling the pupil comprises filling the pupil with a uniformity of at least 70%.

22. The lithographic apparatus according to claim 19, wherein the second beam condition is associated with a filling of the pupil corresponding to an intensity distribution selected from the group of an annular distribution, a distribution with at least two poles, a dipole distribution, a quadrupole distribution and a circular low-NA distribution.

23. The lithographic apparatus according to claim 14, wherein:
the pattern comprises an alignment mark,
the projection system is arranged and constructed to provide to the sensor, within the measurement phase, an aerial image of the alignment mark, and
the sensor is a pattern matching sensor comprising a sensor match pattern and arranged and configured to receive the aerial image, to determine a match between the sensor match pattern and the aerial image, and to provide the sensor output signal in dependence on the match between the sensor match pattern and the aerial image.

24. The lithographic apparatus according to claim 14, wherein:
the pattern comprises a wavefront sensing structure,
the projection system is arranged and configured to provide to the sensor, within the measurement phase, a wavefront of the patterned radiation beam formed by the wavefront sensing structure, and
the sensor is a wavefront sensor arranged and configured to receive the wavefront, to determine a wavefront quality parameter of the wavefront, and to provide the sensor output signal in dependence on the wavefront quality parameter.

25. The lithographic apparatus according to claim 24, arranged and configured to operate with a patterning device comprising the wavefront sensing structure.

26. The lithographic apparatus according to claim 24, wherein:
the sensor comprises a sensor selected from the group consisting of:
a shear interferometer arranged and configured to determine the wavefront quality using shear interferometry;
a point diffraction interferometer arranged and configured to determine the wavefront quality using point diffraction interferometry; and
a hartman-shack wavefront sensor arranged and configured to determine the wavefront quality using hartman-shack sensing.

27. A device manufactured using the apparatus according to claim 14.

28. A patterning device comprising a wavefront sensing structure for use with a lithographic apparatus according to claim 24.

29. A device manufacturing method according to claim 1, wherein the steering the different parts of the radiation beam individually into different directions is performed within a time period of 0.5 seconds.

30. A device manufacturing method according to claim 1, wherein the steering the different parts of the radiation beam individually into different directions is performed within a time period of 5 ms.

31. A device manufacturing method according to claim 1, wherein the steering the different parts of the radiation beam individually into different directions is performed within a time period of 50 ms.

32. A lithographic apparatus according to claim 14, wherein the steering device is configured to be switchable between providing the first conditioned beam and providing the second conditioned beam within a time period of 0.5 seconds.

33. A lithographic apparatus according to claim 14, wherein the steering device is configured to be switchable between providing the first conditioned beam and providing the second conditioned beam within a time period of 50 ms.

34. A lithographic apparatus according to claim 14, wherein the steering device is configured to be switchable between providing the first conditioned beam and providing the second conditioned beam within a time period of 5 ms.

* * * * *